(12) United States Patent
Nishizawa

(10) Patent No.: US 7,807,499 B2
(45) Date of Patent: Oct. 5, 2010

(54) STACKED MODULE AND MANUFACTURING METHOD THEREOF

(75) Inventor: Yoshihiko Nishizawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 113 days.

(21) Appl. No.: 11/688,362

(22) Filed: Mar. 20, 2007

(65) Prior Publication Data

US 2007/0161266 A1 Jul. 12, 2007

Related U.S. Application Data

(63) Continuation of application No. PCT/JP2005/008969, filed on May 17, 2005.

(30) Foreign Application Priority Data

Sep. 29, 2004 (JP) ............................. 2004-284631

(51) Int. Cl.
*H01L 21/00* (2006.01)
(52) U.S. Cl. ................. 438/107; 438/113; 257/E21.599
(58) Field of Classification Search .................. 438/107, 438/113; 257/E21.599
See application file for complete search history.

(56) References Cited

U.S. PATENT DOCUMENTS

| | | | |
|---|---|---|---|
| 5,222,014 A | 6/1993 | Lin | |
| 5,525,402 A | 6/1996 | Nakamura et al. | |
| 5,600,541 A | 2/1997 | Bone et al. | |
| 5,907,187 A * | 5/1999 | Koiwa et al. | 257/737 |
| 6,188,127 B1 | 2/2001 | Senba et al. | |
| 2002/0005567 A1 | 1/2002 | Sakai et al. | |
| 2002/0117743 A1* | 8/2002 | Nakatani et al. | 257/687 |
| 2002/0152610 A1* | 10/2002 | Nishiyama et al. | 29/840 |
| 2005/0151303 A1* | 7/2005 | Konishi et al. | 264/618 |

FOREIGN PATENT DOCUMENTS

| | | |
|---|---|---|
| JP | 06-013541 A | 1/1994 |
| JP | 07-202422 A | 8/1995 |
| JP | 07-263625 A | 10/1995 |
| JP | 08-236694 A | 9/1996 |
| JP | 09-083141 A | 3/1997 |
| JP | 11-008474 A | 1/1999 |
| JP | 11-251515 A | 9/1999 |

(Continued)

OTHER PUBLICATIONS

Official Communication for PCT Application No. PCT/JP2005/008969; mailed on Jun. 21, 2005.

(Continued)

*Primary Examiner*—Trung Dang
(74) *Attorney, Agent, or Firm*—Keating & Bennett, LLP

(57) ABSTRACT

A manufacturing method of a stacked module includes a step of fabricating the first wiring board which includes a wiring pattern provided on at least one of a surface and an inner portion and a bump electrode which is integrated from the simultaneous sintering with the wiring pattern, and which extends in the vertical direction, a step of layering the first wiring board with the second wiring board having the wiring pattern provided on at least one of the surface and the inner portion thereof to be connected to the second wiring board via the bump electrode.

14 Claims, 13 Drawing Sheets

FOREIGN PATENT DOCUMENTS

| | | |
|---|---|---|
| JP | 2001-177235 A | 6/2001 |
| JP | 2001-267490 A | 9/2001 |
| JP | 2002-026513 A | 1/2002 |
| JP | 2003-273160 A | 9/2003 |
| JP | 2004-165318 A | 6/2004 |
| JP | 2004-207495 A | 7/2004 |

OTHER PUBLICATIONS

Official Communication issued in corresponding Japan Patent Application No. 2006-537634, mailed on Feb. 9, 2010.

Official Communication issued in corresponding Japanese Patent Application No. 2006-537634, mailed on Jun. 15, 2010.

* cited by examiner

STACKED MODULE AND MANUFACTURING METHOD THEREOF

BACKGROUND OF THE INVENTION

1. Field of the Invention

The present invention relates to a stacked module including multiple wiring boards that are layered in a vertical direction, a stacked module in which each layer of the wiring boards can be precisely connected, and a manufacturing method thereof.

2. Description of the Related Art

In general, technology of this type has been disclosed in Japanese Unexamined Patent Application Publication No. 7-263625 (Patent Document 1), Japanese Unexamined Patent Application Publication No. 8-236694 (Patent Document 2), Japanese Unexamined Patent Application Publication No. 11-8474 (Patent Document 3), and Japanese Unexamined Patent Application Publication No. 11-251515 (Patent Document 4).

In Patent Document 1, a vertical layered IC chip article is disclosed which includes a discrete chip carrier made of a dielectric tape. This layered IC chip article includes a substrate including multiple fused dielectric tape layers and a hollow space defined by an opening in the upper tape layer, wherein the IC chip is disposed in the hollow space. The layered IC chip article also includes a horizontal wiring path provided on the substrate along one or more of the tape layers, a vertical wiring path which passes through the uppermost tape layer on the substrate and extends toward the horizontal wiring path, an electric connecting unit for connecting the IC chip to the vertical wiring path, a carrier mutual connecting unit for connecting between the vertical wiring paths for adjacent carriers, and a layered connecting unit which connects each carrier mutual connecting unit for performing external connections, for example, to a layered article. Thus, the amount of used surface area is reduced, the advantages of an LTCC configuration are maintained, a standard IC chip can be used, and a 3-dimensional IC chip layered article can be obtained in which substandard chips can be replaced without destroying the other chips of the layered article.

In Patent Document 2, a semiconductor package and a manufacturing method thereof are disclosed. The semiconductor package includes multiple layered carriers, said carriers having a through hole in the inner side or end surface, a conductor pattern provided on at least the surface of the carrier, an inner bonding pad which is electrically connected to the through hole provided on the end surface of the carrier, and LSI chips which are connected and fixed by the inner bonding pad, and which are also connected three-dimensionally with the through hole portion. Thus, a stacked module semiconductor package is obtained which is small, thin, and highly precise, and which has extremely short wiring lengths and good electrical properties, and which is also low-cost and highly reliable, without using wire bonding or TAB methods.

In Patent Document 3, a manufacturing method of a multilayer board is disclosed. This manufacturing method includes a step of providing multiple boards each having electrode pads with semiconductor chips mounted on the front surface and back surface thereof, a step of layering multiple boards by narrowing the soldering member for connecting between the electrode pads of each board, and a step of heating the layered board and melting the connector soldering member to connect each board. Thus, by performing the heating process only one time, the connection reliability between the semiconductor chips and the boards is improved, the manufacturing time is decreased, and the productivity is increased.

In Patent Document 4, a layered semiconductor device module is disclosed in which thermal stress is reduced. With this layered semiconductor device module, a resin fills the spaces between the circuit boards which are made of differing materials, a printed board that functions as a dummy board is layered between the bottom-most ceramic board and a mounting printed board, under a module, and a resin also fills a space between this dummy board and the bottom-most layer of ceramic board. Thus, the terminal stress of the connecting point of the connecting portion between the ceramic board and the printed board adjacent to a BGA-type layered semiconductor device module is eased between the bottom-most layer of ceramic board and the printed wiring board for mounting the module, thereby enabling many variations of circuit board combinations as well as a larger board.

However, with a conventional stacked module manufacturing method, a soldering ball with a Cu core or a sphere-shaped metal is used as the connecting bump between the boards. Therefore, the adhesion members, such as the spheres, cannot be processed at one time as is the case with a printed paste, but rather, the spheres must be disposed one at a time, or a specialized collet must be used for disposing the spheres. Further, in order to prevent the disposed soldering balls from shifting positions, a soldering paste or flax must be provided to fix the sphere-shaped adhesive members beforehand. Therefore, when connecting the boards to one another, the manufacturing processes for forming a connecting bump as described above increase substantially, and since a large amount of time and effort are required, the product cost and the rate of defective goods are increased. With Patent Document 3, the process is simplified by reducing the heat processing from twice to once. However, the processes for painting flax on the surface electrode and for disposing the soldering ball are still required. Thus, from the perspective of the complication of the process, this is no different from the technologies disclosed in the other Patent Documents. In addition, because of the complications involved in the process, a region in the vicinity of the soldering balls must be provided in which certain components cannot be mounted, which prevents the size of the product from being sufficiently reduced.

SUMMARY OF THE INVENTION

To overcome the problems described above, preferred embodiments of the present invention provide a stacked module and a simplified manufacturing method thereof which reduces the rate of defective goods, and significantly lowers the manufacturing cost. In addition, the quality of the produce is improved, and multiple stacked modules can be simultaneously manufactured.

The stacked module manufacturing method according to a preferred embodiment of the present invention includes a step of producing a first wiring board having a bump which is integrated with a board and which extends in a direction that is substantially perpendicular to the surface of the board, and a step of layering the first wiring board with a second wiring board, which includes a wiring pattern provided on at least one of the surface the inner side thereof, and connecting the second wiring board via the bump.

Preferably, the first wiring board further includes a wiring pattern provided on at least one of the surface and the inner side thereof, wherein the bump is a bump electrode integrated by simultaneous sintering with the wiring pattern.

Preferably, the stacked module manufacturing method further includes a step of fabricating a board ceramic green body having a low-temperature sintering ceramic as a primary component and having a green wiring pattern on at least one of the surface and inner side thereof, a step of fabricating a shrinkage suppressing ceramic green body having a hard-to-sinter ceramic as a primary component which is not sintered with the low-temperature sintering ceramic, and having a green via conductor defining the bump electrode, a step of layering the shrinkage suppressing ceramic green body on at least one principal surface of the board ceramic green body, a step of baking both of the ceramic green bodies at a baking temperature for the low-temperature sintering ceramics, and while sintering the board ceramic green body, integrating the green wiring pattern and the green via conductor by simultaneous sintering, and a step of removing the shrinkage suppressing ceramic green body.

Preferably, in the stacked module manufacturing method, the first wiring board further includes the bump electrode on a first principal surface thereof, and at least one of a chip-type passive component and a chip-type active component disposed on at least one of the first principal surface and a second principal surface facing the first principal surface, as a surface mounted component.

Preferably, the first wiring board includes a chip-type active component connected to the first principal surface via a bonding wire.

Preferably, the first wiring board includes a chip-type active component connected to the second principal surface via a soldering bump.

Preferably, the first wiring board further includes a chip-type passive component on the second principal surface, wherein a ceramic sintered article defines an element body and includes a terminal electrode.

Preferably, the bump electrode of the first wiring board has a tapered cross-sectional shape.

Preferably, the bump electrode of the first wiring board is connected to the wiring pattern provided on the surface of the second wiring board via a brazing metal.

Preferably, the first wiring board further includes at least one of a chip-type passive component and a chip-type active component on a second principal surface thereof, and the second wiring board further includes an external connecting electrode on the first principal surface thereof, and another chip-type passive component or chip-type active component on a second principal surface thereof which faces the first principal surface, wherein the wiring pattern of the first wiring board and the wiring pattern of the second wiring board are connected via the bump electrode on the first wiring board, so that the first principal surface of the first wiring board and the second principal surface of the second wiring board face one another.

Preferably, the second wiring board also includes a bump electrode disposed thereon, integrated with the wiring pattern thereof by simultaneous sintering, and wherein the first wiring board and the second wiring board are connected by connecting the bump electrode of the first wiring board and the bump electrode of the second wiring board.

The bump electrode may be provided on both principal surfaces of the first wiring board.

Preferably, the stacked module manufacturing method further includes a step whereby the first wiring board and the second wiring board are connected in a combination board state, and are divided into individual stacked modules.

When the combination board state is divided as described above, the bump electrode is also divided, such that the stacked modules including the divided surface of the bump electrode define a side surface electrode.

In the stacked module manufacturing method, a space between the first wiring board and the second wiring board is sealed with a resin.

A stacked module according to another preferred embodiment of the present invention includes a first wiring board having a bump which is integrated with a board and which extends in a direction that is substantially perpendicular to the surface of the board, and a second wiring board having a wiring pattern provided on at least one of the surface and the inner side thereof, which is layered on the first wiring board and is connected to the first wiring board via the bump of the first wiring board.

Preferably, the first wiring board further includes a wiring pattern provided on at least one of the surface and the inner side thereof, wherein the bump is a bump electrode integrated by simultaneous sintering with the wiring pattern.

Preferably, the first wiring board is a wiring board with a low-temperature sintering ceramic as the primary component thereof.

Preferably, the first wiring board further includes the bump electrode on a first principal surface thereof, and at least one of a chip-type passive component a chip-type active component on at least one of the first principal surface and a second principal surface facing the first principal surface, as a surface mounted component.

Preferably, the bump electrode of the first wiring board has a tapered cross-section.

Preferably, the first wiring board further includes at least one of a chip-type passive component and a chip-type active component on a second principal surface thereof, and the second wiring board further includes an external connecting electrode on the first principal surface thereof, and another chip-type passive component or chip-type active component on a second principal surface thereof which surfaces the first principal surface, wherein the wiring pattern of the first wiring board and the wiring pattern of the second wiring board are connected via the bump electrode on the first wiring board, such that the first principal surface of the first wiring board and the second principal surface of the second wiring board are facing one another.

Preferably, the side surface of the bump electrode defines the side surface electrode on the same plane as the side surface of the first wiring board.

In the stacked module, a space between the first wiring board and the second wiring board is preferably sealed with a resin.

According to preferred embodiments of the present invention, a stacked module and a manufacturing method thereof are provided which simplify the manufacturing process thereof, reduce the rate of defective goods, and lower the cost significantly. In addition, the quality of the product is improved, and multiple stacked modules can be simultaneously produced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 8A through 8C are diagrams illustrating other preferred embodiments of the combination board including a plurality of stacked modules according to the present invention, wherein FIG. 8A is a cross-sectional view illustrating a portion thereof, FIG. 8B is a cross-sectional view illustrating a stacked module divided from the combination board, and FIG. 8C is a cross-sectional view illustrating a bump electrode portion of the stacked module illustrated in FIG. 8B.

DETAILED DESCRIPTION OF PREFERRED EMBODIMENTS

The present invention will be described in the context of various preferred embodiments with reference to FIG. 1 through FIG. 18.

First Preferred Embodiment

Figure 1:
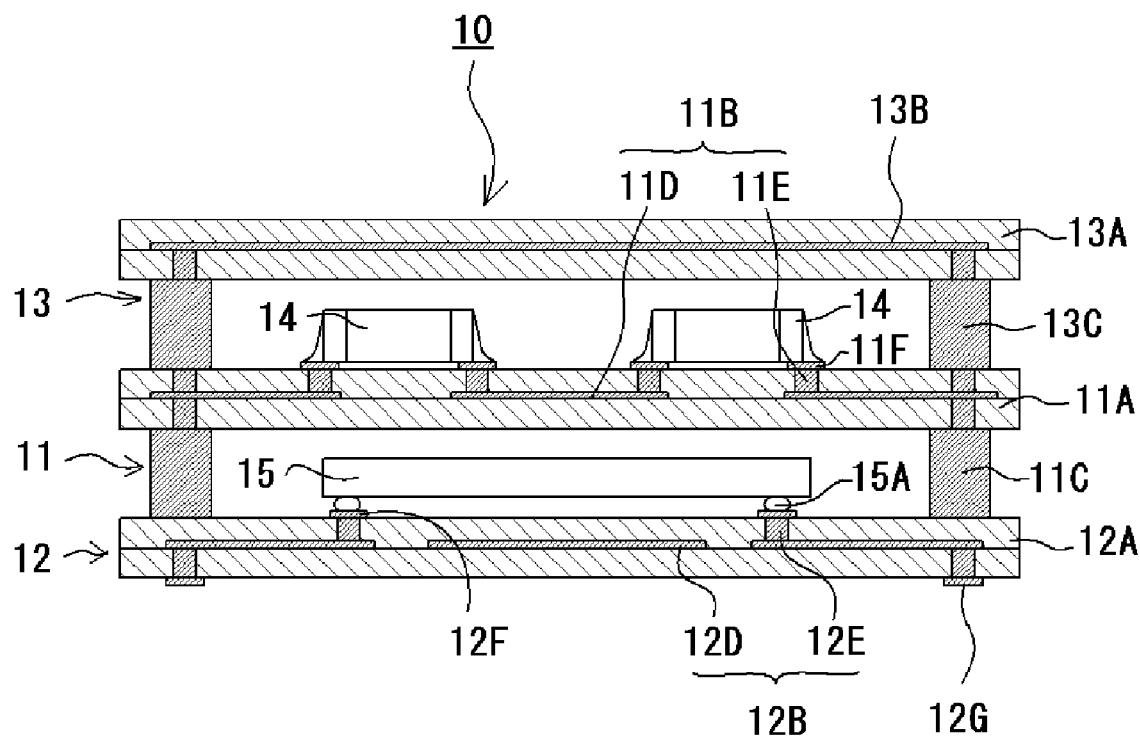
FIG. 1 is a cross-sectional view illustrating a preferred embodiment of the stacked module according to the present invention.

A stacked module 10 according to the present preferred embodiment, as shown in FIG. 1, includes a first wiring board 11, a second wiring board 12 disposed on the lower side of the first wiring board 11, a third wiring board 13 disposed on the upper side of the first wiring board 11, wherein the first, second, and third wiring boards 11, 12, and 13 are arranged so as to be layered with the first wiring board 11 disposed in the center in a vertical direction thereof, and, for example, can be configured to be mounted on a mounting board, such as a motherboard (not shown).

As shown in FIG. 1, the first wiring board 11 includes a board main unit 11A preferably made of a ceramic material, for example, a wiring pattern 11B provided on the board main unit 11A in a predetermined pattern, multiple bump electrodes 11C which are connected to the wiring pattern 11B and which extend vertically downward from the first principal surface (lower surface) of the board main unit 11A. The first wiring board 11 is connected to a second wiring board 12 via the multiple bump electrodes 11C. The wiring pattern 11B includes an in-plane conductor 11D provided in the board main unit 11A in a predetermined pattern, and a via conductor 11E which connects the in-plane conductors 11D and/or extends toward the upper surface and second principal surface (lower surface) of the board main unit 11A from the in-plane conductor 11D.

Also, as shown in FIG. 1, a surface electrode 11F, which is a type of in-plane conductor, is provided on the multiple via conductors 11E which are arranged on the inner side of the bump electrodes 11C and protrudes on the upper surface of the first wiring board 11, and multiple chip-type passive components 14, such as chip-type capacitors or chip-type inductors, in which a ceramic sintered article is an element body thereof, for example, are mounted to the surface electrodes 11F via terminal electrodes via a method using conventionally known solder as a surface mounted component. Also, the height of the bump electrodes 11C can be appropriately adjusted according to the height of the surface mounted components. The height of the bump electrodes described hereafter can be similarly adjusted. Note that from the perspective of the strength of a cylindrical shaped bump electrodes, the diameter thereof is preferably greater than the diameter of the via conductors within the wiring board.

As shown in FIG. 1, a second wiring board 12 includes, for example, a board main unit 12A, a wiring pattern 12B and external terminal electrodes 12G, and is configured in a manner similar to the first wiring board 11. Similar to the first wiring board 11, the wiring pattern 12B includes an in-plane conductor 12D and a via conductor 12E, and while not shown, the via conductor 12E or the surface electrode 12F is connected to the bump electrode 11C of the first wiring board 11. The external terminal electrode 12G is used when being mounted onto a mounting board, such as a motherboard.

Also, as shown in FIG. 1, surface electrodes 12F, which are a type of in-plane conductor, are provided on the multiple via conductors 12E which are arranged on the inner side of the bump electrodes 11C of the first wiring board 11 and protrude on the upper surface of the second wiring board 12, and a chip-type active component 15, such as a semiconductor device or other suitable active component, is connected to the surface electrodes 12F via a solder 15A as a surface mounted component.

Also, as shown in FIG. 1, a third wiring board 13 includes, for example, a board main unit 13A, a wiring pattern 13B and bump electrodes 13C, and is connected to the via conductors 11E or the surface electrodes 11F, which protrude on the upper surface of the first wiring board 11 via the bump electrodes 13C, to protect the inner portion thereof. Also, the in-plane conductor 13D of the third wiring board 13B is defined by a shield electrode, for example, wherein the chip-type passive components 14 or the chip-type active components 15 within the stacked module 10 are protected from an external electromagnetic field by this shield electrode.

In FIG. 1, a configuration in which only a chip-type passive component 14 is mounted on the upper surface of the first wiring board 11 is illustrated. However, chip-type active components 15 other than chip-type passive components 14 may be mounted as required, and alternatively, only a chip-type active component 15 may be mounted. Also, on the lower surface of the first wiring board 11, chip-type passive components 14 and/or chip-type active components 15 may also be mounted at locations in which these components do not interact with the surface mounted components of the second wiring board 12. The second wiring board 12 can be similarly configured. That is to say, chip-type passive components 14 and/or chip-type active components 15 may be mounted on each of the upper surfaces and the lower surfaces of the first and second wiring boards 11 and 12, as required.

Accordingly, with the first, second, and third wiring boards 11, 12, and 13, the respective wiring patterns 11B, 12B, and 13B are each electrically connected via the bump electrodes 11C and 13C, and the chip-type passive components 14 and chip-type active components 15 perform functions according to a predetermined objective. Note that the board main units 11A, 12A, and 13A include multiple (two layers in the present preferred embodiment) layers of ceramic layers.

The board main units 11A, 12A, and 13A of the first, second, and third wiring boards 11, 12, and 13 are each made of a ceramic material. As a ceramic material, for example, a low-temperature sintered ceramic (LTCC: Low Temperature Co-baked Ceramic) material may be used. A low-temperature sintered ceramic is a ceramic material which can be sintered at a temperature of about 1050° C. or less and which permits simultaneous baking with silver or copper which have low specific resistances. As for a low-temperature sintered ceramic, specifically, a glass complex system LTCC material which combines a borate silicate acid with a ceramic powder, such as alumina, forsterite or other suitable ceramic powder, a crystallized glass LTCC material using a crystallized glass of a ZnO—MgO—$Al_2O_3$—$SiO_2$, a non-glass LTCC material using a BaO—$Al_2O_3$—$SiO_2$ ceramic powder, a $Al_2O_3$—CaO—$SiO_2$—MgO—$B_2O_3$ ceramic powder or other suitable ceramic powder, are examples thereof.

The wiring patterns 11B, 12B, and 13B, the bump electrodes 11C and 13C, and the external terminal electrode 12C may each be made of a conductive metal. For the conductive metal, a metal including at least one type of Ag, Ag—Pt alloy, Cu, Ni, Pt, Pd, W, Mo, and Au as a primary component may be used. Of these conductive metals, Ag, Ag—Pt alloy, Ag—Pd alloy, and Cu are preferably used since the specific resistances thereof are low. Also, when using a low-temperature sintered ceramic as the material for the board main units 11A, 12A, and 13A, a metal, such as Ag, Cu or other metal, having low resistance and a low melting point of about 1050° C. or less can be used, such that the board main units 11A, 12A, and 13A, wiring patterns 11B, 12B, and 13B, bump electrodes 11C and 13C, and the external terminal electrode 12C can be simultaneously baked at a low temperature of about 1050° C. or less.

Next, description will be provided regarding a preferred embodiment of the stacked module manufacturing method according to the present invention. With the present preferred embodiment, a step of fabricating the first wiring board 11, having the wiring pattern 11B provided on the surface and/or internally and a bump electrode 11C which is integrated with the wiring pattern 11B and which extends in a vertical direction by simultaneous baking with the wiring pattern 11B, and a step of connecting the first wiring board 11 to the second wiring board 12 by layering with the second wiring board 12 which has a wiring pattern 12B provided on the surface and/or internally, via the bump electrode 11C are provided.

The stacked module manufacturing method according to the present preferred embodiment will be described in detail with reference to FIG. 2A through FIG. 4B. With the present preferred embodiment, a wiring board including a bump electrode attached thereto is fabricated using a non-contraction construction method. A non-contraction construction method is a method in which the dimensions in the planar direction of the ceramic board do not substantially change before and after baking of the ceramic board. With this non-contraction construction method, a shrinkage suppression ceramic green sheet is used, which will be described later.

1. Fabrication of Wiring Board

A. Fabrication of First Wiring Board 11

1) Fabrication of Ceramic Green Body for Board (Green Sheet for Board)

Figure 2A:
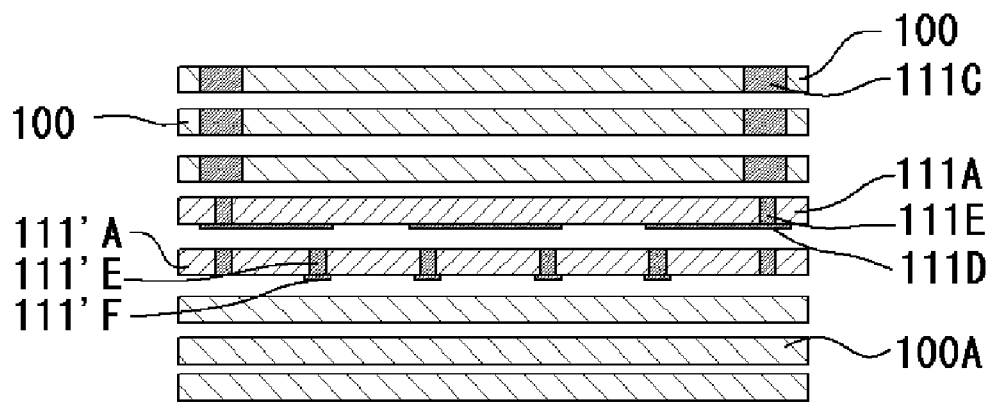
FIGS. 2A through 2D are process diagrams each illustrating the main portions of a manufacturing process of the stacked module illustrated in FIG. 1.

First, for a low temperature sintered ceramic powder, for example, a powder mixture made of an alumina powder and a borate silicate acid, for example, is adjusted. This powder mixture is scattered in an organic vehicle to adjust the slurry, and by forming this into a sheet form with a casting method, a predetermined number of the board ceramic green sheet 111A shown in FIG. 2A are fabricated at a thickness of, for example, about 20 μm. Next, after a via hole is formed in a predetermined pattern on the board ceramic green sheet 111A using a laser light or metal mold, for example, this via hole is filled with a conductive paste to form the green via conductor 111E. For a conductive paste, for example, Ag can be used as the primary component therein. Next, the same conductive paste can be printed onto the board ceramic green sheet 111A in a predetermined pattern using a screen printing method, for example, to form a green in-plane conductor 111D. Also, a green via conductor 111'E and a green surface electrode 111'F are similarly formed on another board ceramic green sheet 111'A. In this case, a capacitor, a coil, and a shielding ground electrode are formed on one or both of the board ceramic green sheets 111A and 111'A, thereby providing the capacitor, the coil, and the shielding ground electrode in both of the board ceramic green sheets 111A and 111'A.

2) Fabrication of Shrinkage Suppression Ceramic Green Compact (Shrinkage Suppression Ceramic Green Sheet)

The shrinkage suppression ceramic green sheet includes hard-to-sinter ceramic as the primary component thereof, which cannot sinter at the baking temperatures of low temperature sintered ceramics. For a hard-to-sinter ceramic powder, for example, an alumina powder is prepared, this alumina powder is scattered in an organic vehicle to adjust the slurry, and by forming this into a sheet shape with a casting method, a predetermined number of the shrinkage suppression ceramic green sheets 100 shown in FIG. 2A are fabricated. The baking temperature of the shrinkage suppression ceramic green sheet 100 is about 1500° C. to about 1600° C., and since a baking temperature significantly higher than that of the sintering temperature (about 1050° C. or less) for the board ceramic green sheet 111A formed from low-temperature sintered ceramic is required, sintering is not performed at the baking temperature for the board ceramic green sheet 111A. After forming via holes for the bump electrodes in a predetermined pattern on the shrinkage suppression ceramic green sheet 100 using laser light or a metal mold, a green via conductor 111C is formed within this via hole. For example, three of these shrinkage suppression ceramic green sheets 100 are fabricated as shown in FIG. 1. Three shrinkage suppression ceramic green sheets 100 are also similarly fabricated as shown in the same diagram without the green via conductor 111C. For a hard-to-sinter ceramic powder, for example, other than alumina, a ceramic powder, such as zirconia or magnesia, may be used. For the shrinkage suppression ceramic green sheets 100, a ceramic component which is the same as the ceramic component included in the board ceramic green sheet 111A is preferable. Note that when electrical conductivity is not required at a particular portion, the via hole at that portion can be filled with a ceramic paste (a low-temperature sintered ceramic as the primary component), thereby also enabling this via hole to be used as a connecting bump, such as a spacer.

3) Fabrication of Layered Article

Figure 2B:
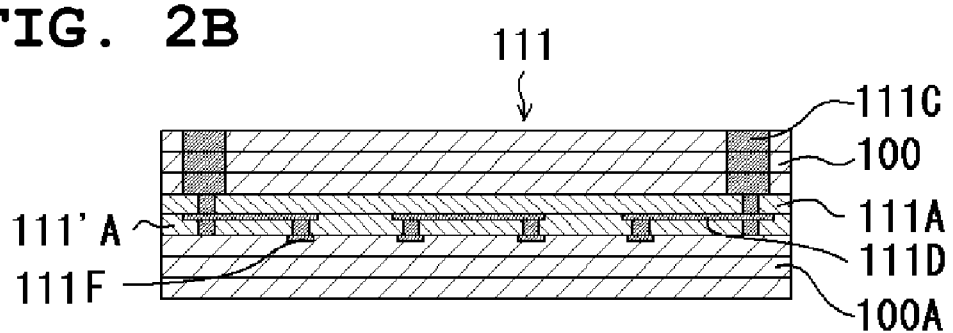
Figure 2C:
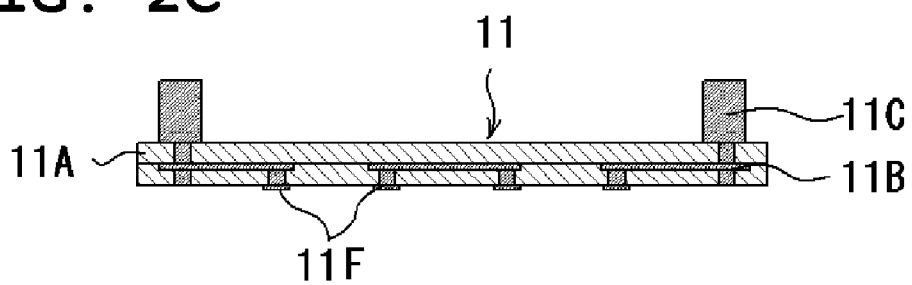

As shown in FIG. 2B, three shrinkage suppression ceramic green sheets 100A which do not include the green via conductor 111C are layered, and on top of this, a board ceramic green sheet 111'A having a green surface electrode 111F is layered with the board ceramic green sheet 111'A facing downwards, and further, on top of this, a board ceramic green sheet 111A having a green in-plane conductor 111D is layered with the green in-plane conductor 111D facing downwards. Next, after layering the three shrinkage suppression ceramic green sheets 100 having green via conductors 111C, each layer is pressed and pressure bonded at a pressure of about 200 kg/cm² to about 1500 kg/cm² in the layered direction (vertical direction) so as to obtain a layered article 111 shown in FIG. 2B, wherein these layers are integrated.

4) Baking of the Layered Article

If the layered article 111 is baked at a predetermined temperature of about 1050° C. or less, for example, the shrinkage suppression ceramic green sheets 100 and 100A are not sintered, and since shrinkage does not occur in the facing direction, even if the green wiring pattern 111B, the green via conductor 111C of the board ceramic green sheet 111A, green in-plane conductor 111D and other elements are sintered and integrated, shrinkage does not occur in the facing direction because of the shrinkage suppression ceramic green sheets 100 and 100A. Thus, the first wiring board 11 shown in FIG. 2C can be fabricated with the highly precise wiring pattern 11B, which is only shrunk in the height direction, and the bump electrode 11C. Since the first wiring board 11 is only shrunk in the height direction, this enables a reduced height of the stacked module 10. With the baking, the shrinkage suppression ceramic green sheets 100 and 100A become an aggregate of alumina powder because the organic vehicle is burnt up. The alumina powder aggregate can be easily removed with a blasting process. Thus, by removing the alumina powder, the first wiring board 11 is easily obtained. For example, when the board ceramic green sheet 111A has a thickness of about 20 μm, the total thickness is about 40 μm thick when two layers are provided. However, with the baking, the board ceramic green sheet 111A can be shrunk down in the height direction to obtain a board main unit 11A having a thickness of about 20 μm.

5) Plating Processing

Following fabrication of the first wiring board 11, a plating process is performed with a metal plating, for example, on the bump electrode 11C and the surface electrode 11F, which increases the wettability of the contact member, such as solder or other suitable contact member.

6) Mounting of Surface Mounted Components

Figure 2D:
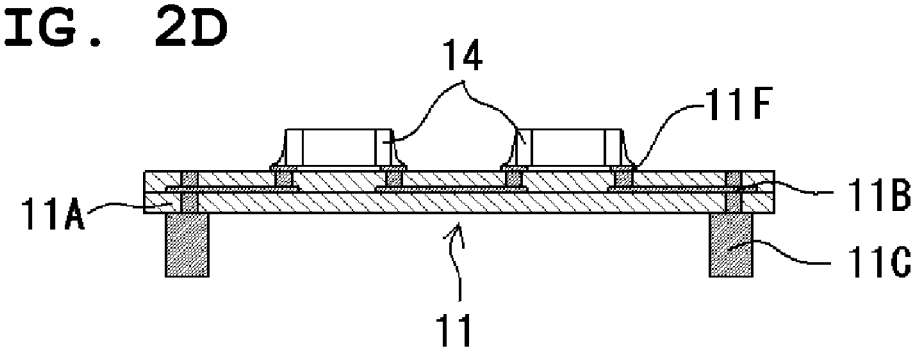

In the case of mounting a chip-type passive component 14 on the first wiring board 11, the bump electrode 11C is faced downward as shown in FIG. 2D, the surface electrode 11F is faced upward, and the chip-type passive components 14 are mounted on the surface (second principal surface) on which the bump electrode 11C is not formed. In this case, after coating the predetermined surface electrode 11F with a soldering paste using a metal mask, for example, the chip-type passive component 14 is mounted using a mounter and positioned. Next, by performing a heating process, such as a reflow process, the solder is melted and the chip-type passive component 14 is mounted on the upper surface of the first wiring board 11, as shown in FIG. 2D. Thus, when using a metal mask at the time of mounting, the metal mask must be adhered to the mounting surface, and thus, it is preferable that the bump electrode 11C is not formed on the mounting surface.

With steps 1) through 6) described above, a first wiring board 11 on which surface mounted components are mounted is obtained.

B. Fabrication of Second and Third Wiring Boards 12 and 13

Figure 3A:
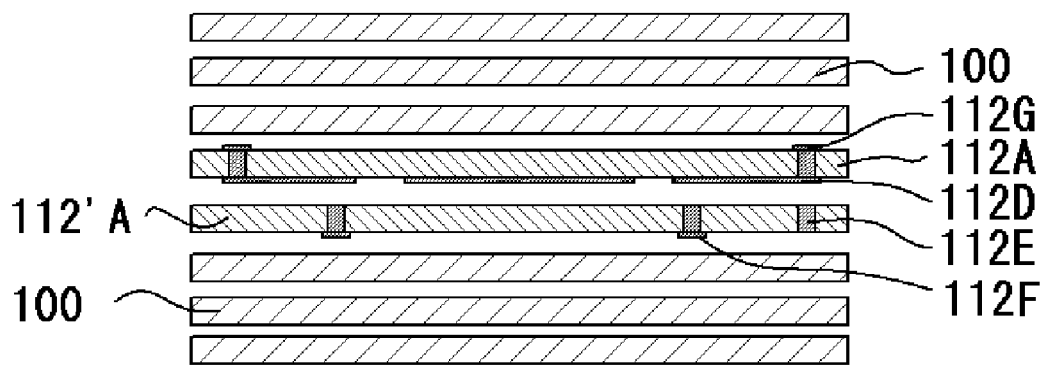
FIGS. 3A through 3D are process diagrams each illustrating the main portions of a manufacturing process of the stacked module illustrated in FIG. 1.

The second wiring board 12 is fabricated with the same procedures as the first wiring board 11. The second wiring board 12 does not include any bump electrodes. Thus, when fabricating the second wiring board 12, as shown in FIG. 3A, the second wiring board 12 can be fabricated in the same manner as the first wiring board 11, except for using a shrinkage suppression ceramic green sheet 100 which does not include a green via conductor. That is to say, a board ceramic green sheet 112A having a green in-plane conductor 112D, a green external terminal electrode 112G, and a green via conductor 112E is fabricated, while fabricating a board ceramic green sheet 112'A having a green external terminal electrode 112G and a green via conductor 112E.

Figure 3B:
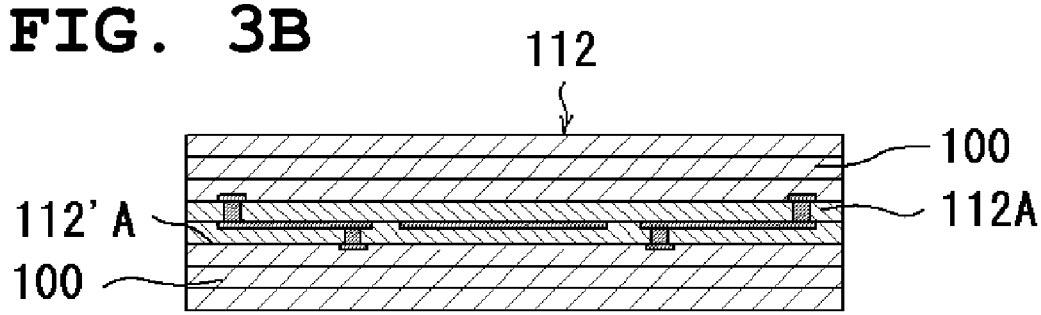
Figure 3C:
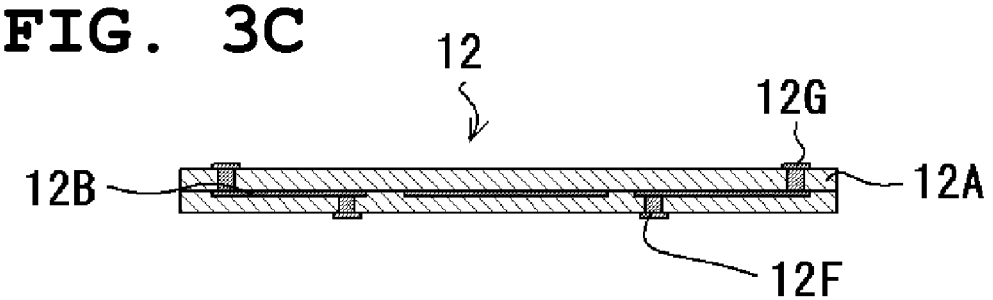
Figure 3D:
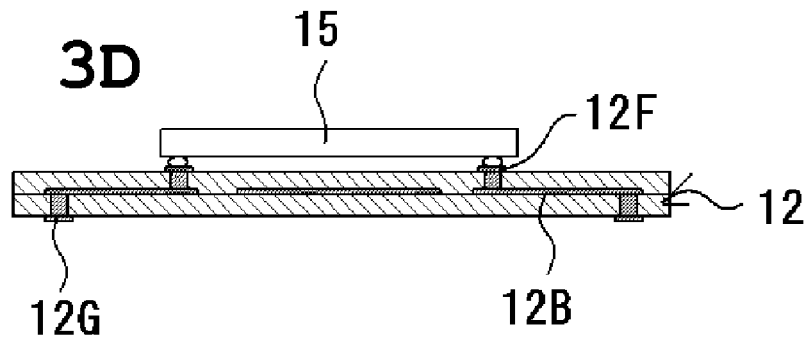

Then, as shown in FIG. 3A, a predetermined number (three in FIGS. 3A and 3B) of previously fabricated shrinkage suppression ceramic green sheets 100 are layered, and board ceramic green sheets 112'A and 112A are layered thereon in this order to be aligned and layered, following which three shrinkage suppression ceramic green sheets 100 are layered thereon, and pressure bonding is performed at a predetermined pressure to fabricate the layered article 112 shown in FIG. 3B. Next, by baking the layered article 112 at a predetermined temperature, the second wiring board 12 shown in FIG. 3C is obtained. Then, the second wiring board 12 is turned over to the back side, following which the flax is coated on the surface electrode 12F, the chip-type active component 15 is mounted via a soldering bump, for example, and by performing heating processing, the second wiring board 12 on which the chip-type active component 15 is mounted is obtained, as shown in FIG. 3D. The third wiring board 13 is also fabricated using the procedures described above.

C. Layering of First, Second, and Third Wiring Boards 11, 12, 13

In the case of layering the first, second, and third wiring boards 11, 12, and 13, these wiring boards 11, 12, and 13 are layered in a predetermined order and aligned with one another, the via conductors or surface electrode (not shown) of the second wiring board 12 and the bump electrode 11C of the first wiring board 11 are connected, and via conductor 11E or surface electrode 11F of the first wiring board 11 and the bump electrode 13C of the third wiring board 13 are connected to produce the stacked module 10.

As a method for connecting the bump electrode 11C of the first wiring board 11 with the second wiring board 12, or connecting the bump electrode 13C of the third wiring board 13 with the first wiring board 11 in this event, for example, a method may be used in which a brazing metal is coated on each bump electrode 11C and 13C. For a brazing metal, any liquid form or semi-liquid form is acceptable, but a soldering paste, a conductive resin, or other suitable brazing metal is preferably used.

Figure 4A:
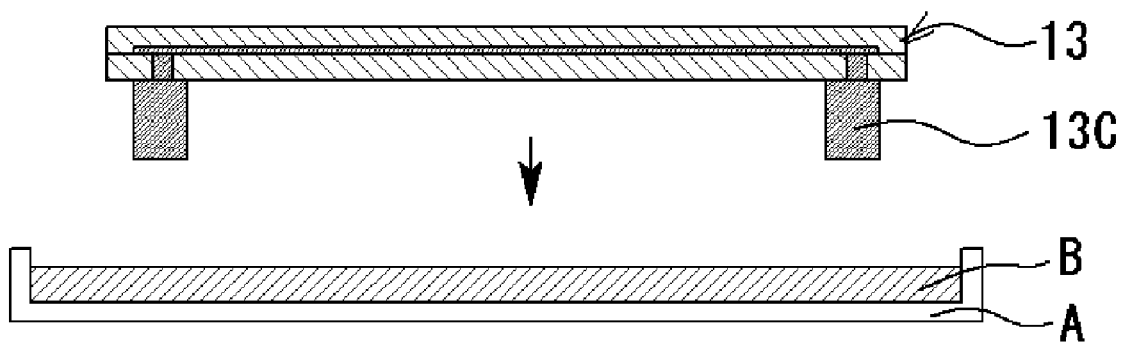
FIGS. 4A and 4B are process diagrams each illustrating the main portions of a manufacturing process of the stacked module illustrated in FIG. 1.
Figure 4B:
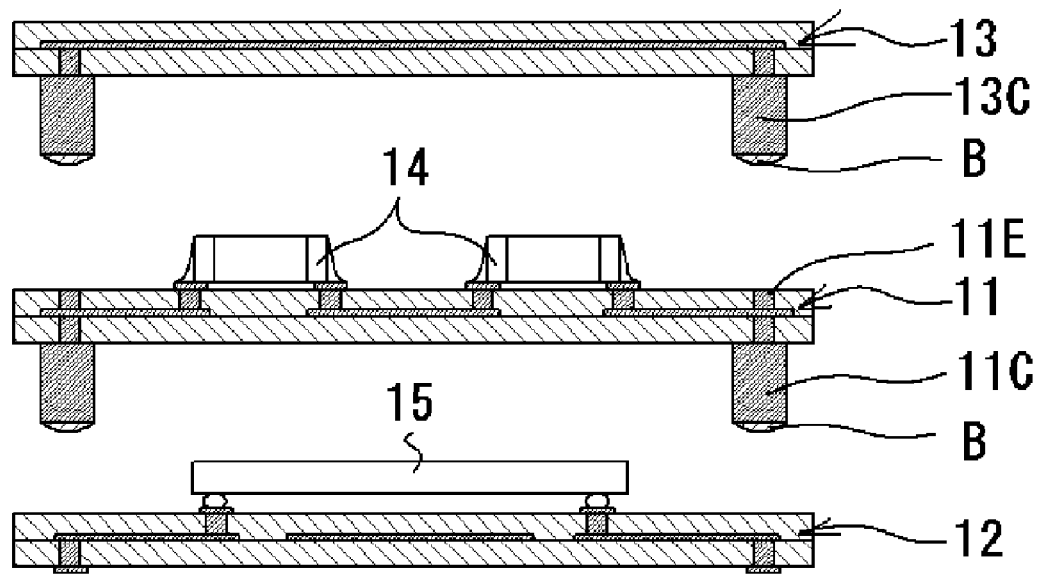

The method for coating the brazing metal is performed as follows. That is to say, for example as shown in FIG. 4A, the bump electrode 13C of the third wiring board 13 is moved in contact with the liquid brazing material B within container A, and thus, the brazing material B is directly transferred onto the tip surface of the bump electrode 13C. The bump electrode 11C of the first wiring board 11 is also similarly subjected to transfer of the brazing material, although this is not shown in the diagram. Then, as shown in FIG. 4B, following alignment of the bump electrode 11C of the first wiring board 11 and the via conductor or the surface electrode (not shown) of the second wiring board 12, or the bump electrode 13C of the third wiring board 13 and the via conductor 11E or the surface electrode of the first wiring board 11, the first, second and third wiring boards 11, 12, and 13 are layered to connect these three boards as the stacked module 10.

Also, as another coating method, for example, following the brazing material being coated on the via conductor 11E of the first wiring board 11, alignment is performed on the via conductor 11E of the first wiring board 11 and the bump electrode 13C of the third wiring board 13 to connect the wiring boards 11, 13. In the case of the former method shown in FIG. 4A, the metal mask which is required in the latter case is not needed, and furthermore, there is an advantage in that numerous types of products with different shapes can be manufactured using the same process, and in the case of semiconductor manufacturing device for performing production of many types of products at low volume, manufacturing costs are greatly reduced by using a unified process. Also, in the case in which electrical connectivity is not required, an insulating adhesive can be used.

The method for matching the wiring boards to one another is not particularly limited, but generally an alignment method using an image recognition device can be suitably used. Also, with the present preferred embodiment, the first, second and third wiring boards 11, 12, and 13 are fabricated with a non-contraction construction method, and thus, fabrication can be performed with high precision without distortion of the first, second and third wiring boards 11, 12, and 13, and therefore alignment with a jig can also be performed.

As described above, according to the present preferred embodiment, the manufacturing method includes a step of fabricating the first wiring board 11 which has a wiring pattern 11B provided on the surface and/or inner portion of the board main unit 11A and a bump electrode 11C which is integrated from the simultaneous baking with the wiring pattern B and which extends in the vertical direction, a step of layering the first wiring board 11 with the second wiring board 12 having the wiring pattern 12B provided on the surface and/or inner portion thereof with the first wiring board 11 to be connected to the second wiring board 12 via the bump electrode 11C, and a step of layering the third wiring board 13 fabricated with the same procedures as with the first wiring board 11 to be connected to the first wiring board 11 via the bump electrode 13C, and therefore, by matching the respective positions of the bump electrode 11C of the first wiring board 11 and the via conductor or surface electrode of the second wiring board 12, and the third wiring board 13 and the via conductor or surface electrode of the first wiring board 11, the first, second, and third wiring boards 11, 12, 13 are connected in the above-described sequence, such that conventional processes of transferring the flax onto the surface of the wiring board or processing of disposing minute soldering balls are omitted. Thus, the manufacturing cost of the stacked module 10 is significantly reduced.

Also, with the present preferred embodiment, the bump electrodes 11C and 13C of the respective first and third wiring boards 11 and 13 are sintered to be integrated with the wiring patterns 11B and 13B and thus formed simultaneously, the bump electrodes 11C and 13C can be formed with good precision and without problems occurring, such as irregularities, position shifting, or oxidation of the solder, and thus, the wiring boards are securely connected to one another with high precision, and a high quality stacked module 10 is obtained.

Also, according to the present preferred embodiment, when fabricating the first, second, and third wiring boards 11, 12, and 13, in order to bake the layered article 110, which is layered by disposing shrinkage suppression green sheets 100 and 100A on both of the top and bottom surfaces of the board ceramic green sheets 111A and 112A which are layered on one another, at a temperature at which the alumina powder, which is a primary component of the shrinkage suppression green sheets 100 and 10A, does not sinter, shrinkage does not occur in the facing direction of the first, second, and third wiring boards 11, 12, and 13, but rather, shrinkage occurs only in the height direction. Thus, the wiring patterns 11B, 12B, and 13B or the bump electrodes 11C and 13C can be formed with high precision without distortion occurring in the facing direction of each wiring board 11, 12, and 13, and a stacked module with a low height is produced. Moreover, the surface mounted components can be precisely mounted with respect to first and second wiring boards 11 and 12. Also, since the green via conductor 111C used with a bump electrode is formed on the shrinkage suppression green sheet 100, the positioning accuracy of the bump electrode is improved, and a narrower pitch of the bump electrodes is achieved. Thus, a smaller stacked module 10 is produced.

Second Preferred Embodiment

With the stacked module according to the present preferred embodiment, portions which are similar or equivalent to the above-described preferred embodiment will be described using the same reference numerals. The stacked module 10 of the present preferred embodiment includes a first wiring board 11, a second wiring board 12 which is connected on the lower side of the wiring board 11, and a third wiring board 13 which is connected on the upper side of the first wiring board 11, and the board configuration is similar to that of the above-described preferred embodiment. Accordingly, the first, second, and third wiring boards 11, 12, and 13 are fabricated using the substantially same procedures used for above-described preferred embodiment.

Figure 5A:
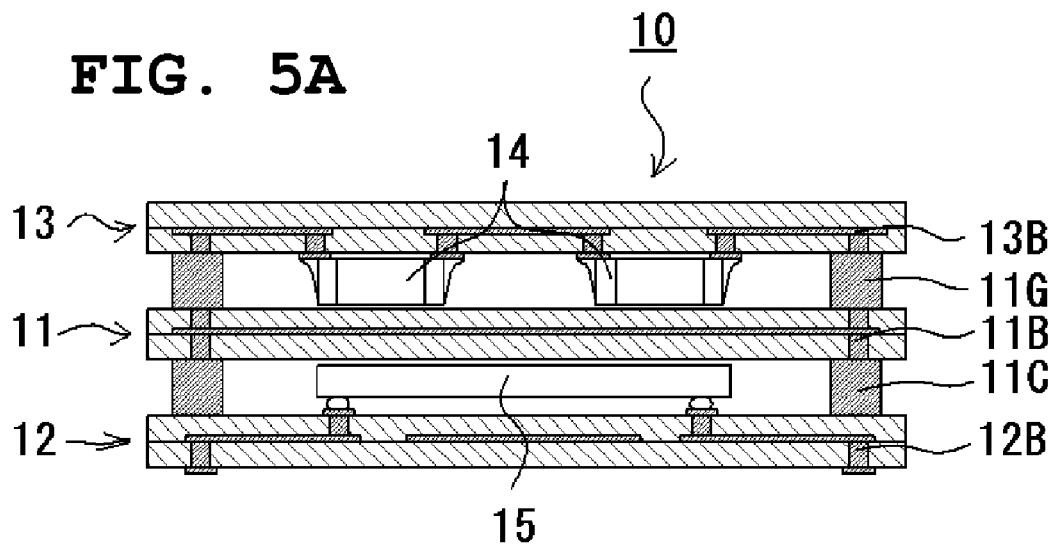
FIGS. 5A through 5C are process diagrams illustrating yet another preferred embodiment of the stacked module according to the present invention.

In addition, with the present preferred embodiment, as shown in FIG. 5A, the chip-type passive components 14, which are mounted on the first wiring board in the above-described preferred embodiment, are mounted on the lower surface of the third wiring board 13, and no surface mounted components are mounted on the first wiring board 11. Accordingly, a wiring pattern 11B defining a grounding electrode is formed on the first wiring board 11, and a wiring pattern 13B for mounting the chip-type passive components 14 is formed on the third wiring board 13. Further, with the present preferred embodiment, as shown in FIG. 5A, the bump electrodes 11C and 11G are provided on both of the top and bottom surfaces of the first wiring board 11, and there are no bump electrodes provided on the second and third wiring boards 12 and 13.

Figure 5B:
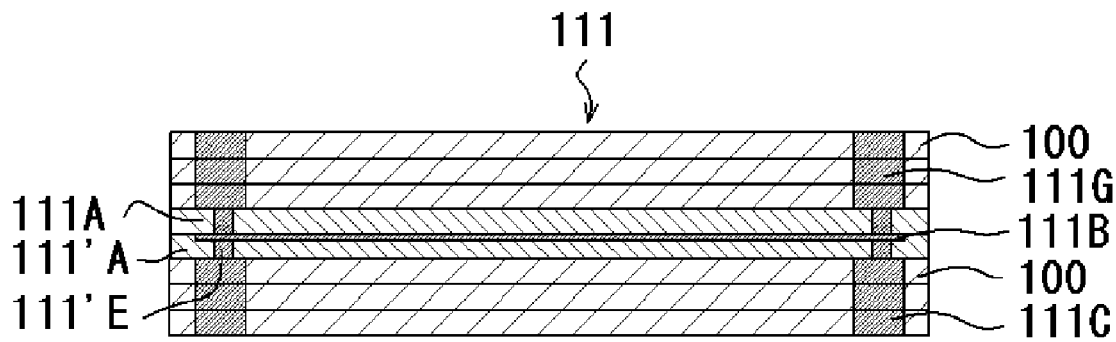

Thus, when fabricating the fist wiring board 11 of the present preferred embodiment, as shown in FIG. 5B, the board ceramic green sheet 111A in which the green in-plane conductor 111B is formed and the board ceramic green sheet 111'A in which the green via conductor 111'E is formed are layered so as to sandwich the green in-plane conductor 111B, and further, three of the shrinkage suppression ceramic green sheets 100 in which the green via conductors 111C and 111G are formed are disposed on both of the top and bottom sides of the board ceramic green sheets 111A and 111'A after determining the positions thereof. After layering the green sheets, the layered article 111 is fabricated by pressing these layers together at a predetermined pressure to pressure-bond. The layered article 111 is baked using the substantially same procedures used for the above-described preferred embodiment, and the wiring pattern 111B and the via conductors 111C and 111G are sintered so as to be integrated. Then, the first wiring board 11 is fabricated by removing the remaining green alumina powder after the shrinkage suppression ceramic green sheet 100 is baked.

Figure 5C:
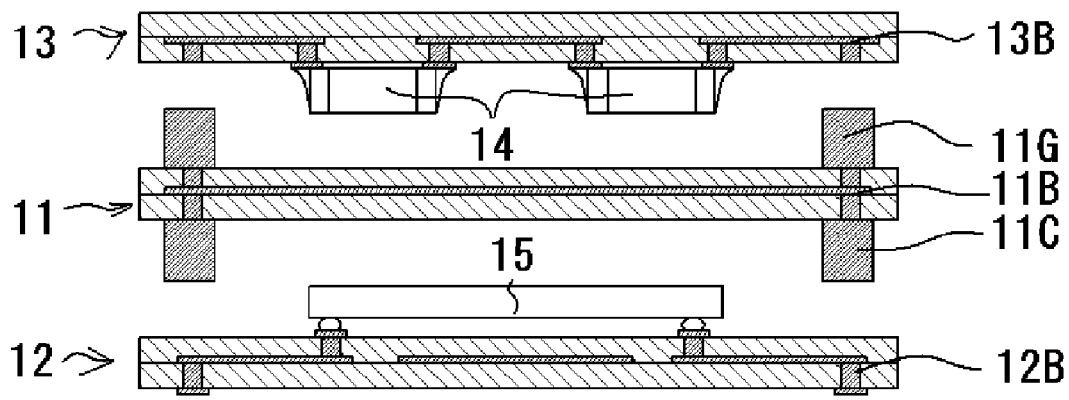

Subsequently, the separately fabricated second the third wiring boards 12 and 13 are layered, as shown in FIG. 5C, so as to be connected. Thus, the stacked module 10 of the present preferred embodiment is obtained.

According to the present preferred embodiment, the second and third wiring boards 12 and 13 on which chip-type passive components 14 and chip-type active components 15 are mounted do not include any bump electrodes, and therefore, there is no obstruction when mounting the surface mounted components. Thus, the surface mounted components, such as the chip-type passive components 14 and chip-type active components 15, can be disposed in various arrangements so as to be mounted, and the freedom of design of the stacked module 10 improved improved.

Third Preferred Embodiment

Each of the above-described preferred embodiments describes a case in which only one stacked module is fabricated. However, usually multiple stacked modules are fabricated simultaneously. Thus, with the present preferred embodiment, a method for fabricating multiple stacked modules simultaneously is described with reference to FIG. 6 and FIG. 7, wherein portions which are similar or equivalent to each of the above-described preferred embodiments will be described using the same reference numerals. With the present preferred embodiment, for example, multiple first wiring boards, second wiring boards, or third wiring boards can be fabricated from one board ceramic green sheet.

For example, in the case of fabricating multiple first wiring boards 11 simultaneously, the necessary number of board ceramic green sheets (not shown) for the first wiring board 11 is fabricated with the same procedures as for the first preferred embodiment. A green wiring pattern is independently provided on the board green sheet for each of the multiple first wiring boards. Then, the shrinkage suppression ceramic green sheet (not shown) is also fabricated with approximately the same surface area as the board ceramic green sheet. A green wiring pattern is formed on the board ceramic green sheet, and a green via conductor for the bump electrode is formed on the shrinkage suppression ceramic green sheet. Then, similar to the first preferred embodiment, the necessary number of shrinkage suppression ceramic green sheets not including a green via conductor are disposed on the lower side of the board ceramic green sheet, and the necessary number of shrinkage suppression ceramic green sheets including a green via conductor are disposed on the upper side of the board ceramic green sheet, following which pressure bonding is performed with a predetermined pressure, followed by baking at a predetermined temperature, to produce several first combination boards 51 sufficient for several first wiring boards 11.

Figure 6:
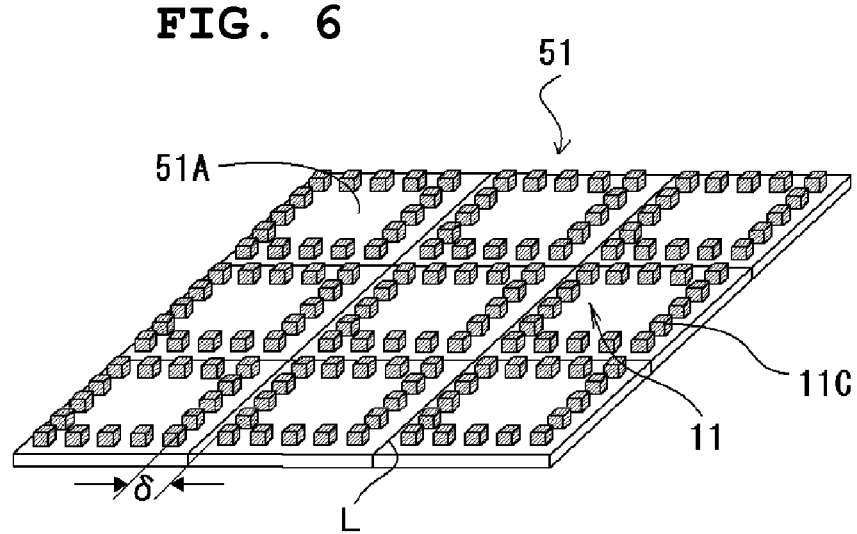
FIG. 6 is a perspective view illustrating a preferred embodiment of a wiring board configuring a combination board including a plurality of the stacked modules according to the present invention.

As shown in FIG. 6, multiple bump electrodes 11C corresponding to the individual first wiring boards 11 are arrayed along the external circumference of the first wiring board 11 on the first combination board 51, whereupon a predetermined spacing δ is provided between the adjoining first wiring boards 11 and 11. When dividing the first combination board 51 into individual first wiring boards 11, the first combination board 51 is cut according to the spacing δ provided between the adjoining first wiring boards 11 and 11. Chip-type passive components 14 are mounted within regions 51A of the multiple first wiring boards 11 in the first combination board 51. Note that, in FIG. 6, the L shown along the spacing δ is a hypothetical dividing line for dividing the first combination board 51 into individual first wiring boards 11.

Figure 7:
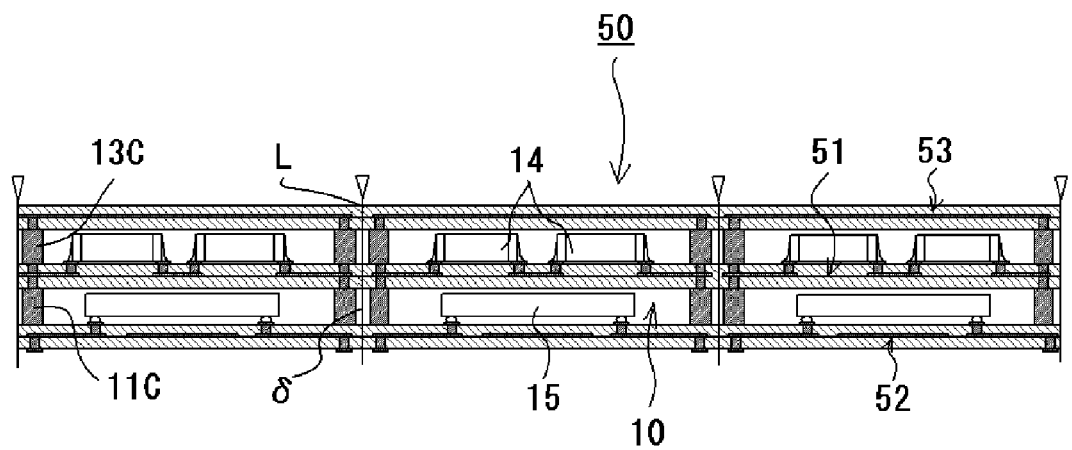
FIG. 7 is a cross-sectional view illustrating a portion of the combination board including the wiring board illustrated in FIG. 6.

Similarly, with the second and third wiring boards, the second and third combination boards 52 and 53 are each fabricated which include multiple second and third wiring boards 12 and 13, as with the first wiring board 11. The chip-type active components 15, for example, are mounted on each of the regions of the multiple second wiring boards 12 of the second combination boards 52, as shown in FIG. 7. Multiple bump electrodes 13C corresponding to the third wiring board 13 are formed on the third combination board 53, as shown in FIG. 7, in the same manner as with the first combination board 51.

Alignment of the first, second, and third combination boards 51, 52, and 53 is performed, wherein the first second and third combination boards 51, 52, and 53 are layered in the same order as in the first preferred embodiment, each of the combination boards are joined to each other via the brazing material, and heat processing is performed to obtain the combination board 50 shown in FIG. 7. This combination board 50 includes multiple stacked modules 10. Between adjacent stacked modules 10 a spacing δ is provided, and the hypothetical dividing line L is located in this spacing δ. Then, by dicing the combination board 50 along the hypothetical dividing line L, the individual stacked modules 10 are obtained. These stacked modules 10 preferably have essentially the same configuration as that in the first preferred embodiment. Thus, according to the present preferred embodiment, multiple stacked modules 10 are fabricated simultaneously with one baking.

The first, second, and third combination boards 51, 52, and 53 are fabricated using the shrinkage suppression ceramic green sheets 100 and 10A, and therefore, the various wiring patterns and bump electrodes are formed with high precision. Thus, the first, second, and third combination boards 51, 52, and 53 can be aligned using a rack-shaped jig. That is to say, the rack-shaped jig is used to accommodate the first, second, and third combination boards 51, 52, and 53 at each of the end surfaces while position-matching is performed. After a brazing material is coated onto the bump electrodes 11C and 13C of the respective first and third combination boards 51 and 53 (see FIG. 4), the first, second, and third combination boards 51, 52, and 53 are stored in the rack-shaped jig in a predetermined sequence, and by performing heating processing while in this state, the first, second, and third combination boards 51, 52, and 53 can be layered and connected. In this case, a combination board 50 which includes multiple stacked modules 10 can be fabricated without using an image recognition device.

Fourth Preferred Embodiment

Figure 8A:
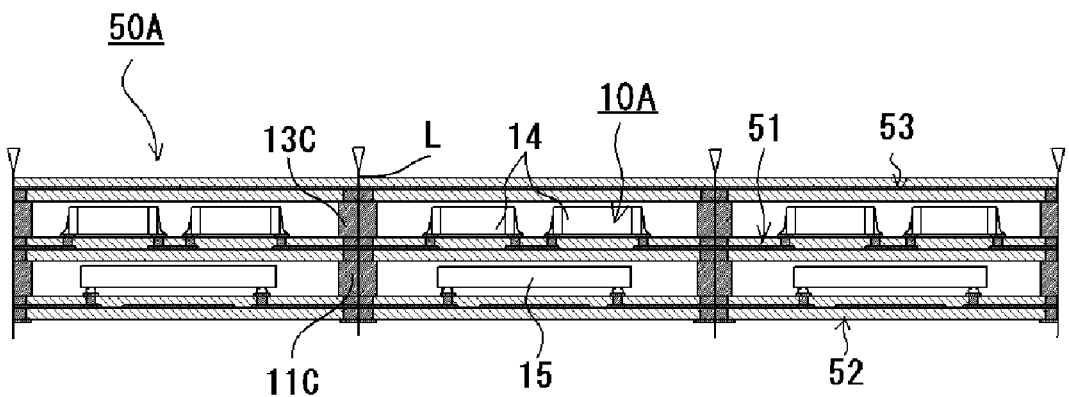
Figure 8B:
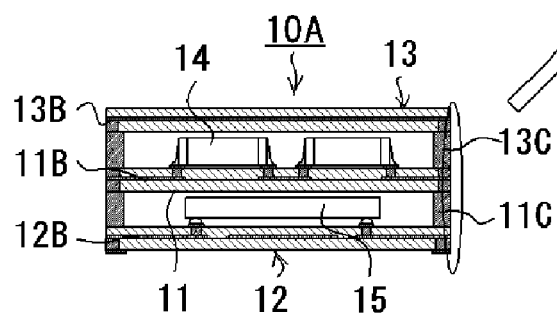
Figure 8C:
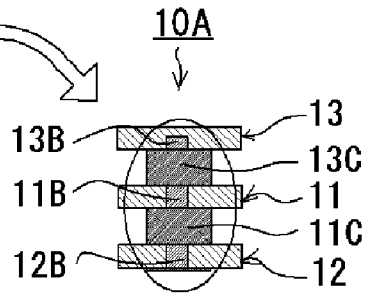

With the present preferred embodiment, the combination board is fabricated with the same procedures used for the third preferred embodiment. However, as shown in FIGS. 8A through 8C, a combination board 50A according to the present preferred embodiment differs from the third preferred embodiment in that the bump electrodes 11C and 13C are shared between the adjacent stacked modules 10, and division is made along the bump electrodes 11C and 13C into individual stacked modules 10. Also, the wiring patterns 11B, 12B, and 13B of the respective adjacent first, second, and third wiring boards 11, 12, and 13 are formed so as to be integrated along the entire surface of the respective combination boards 51, 52, and 53, as shown in the same diagrams.

Figure 9:
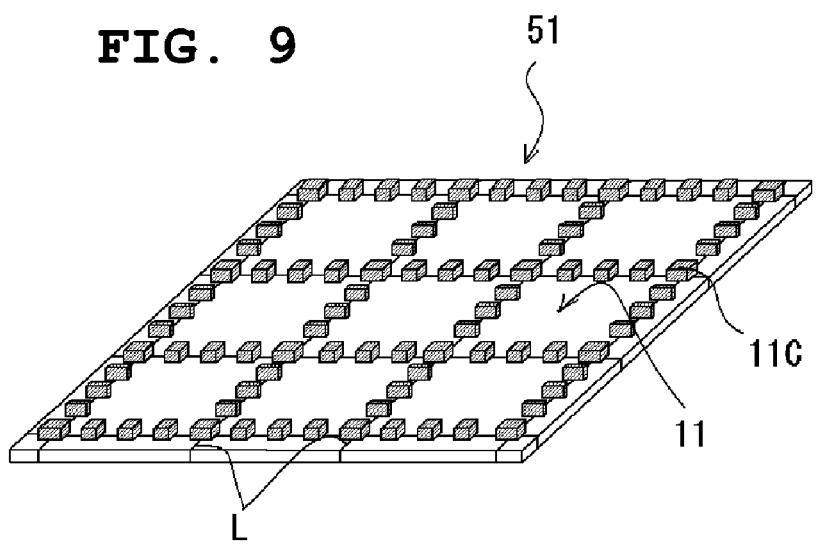
FIG. 9 is a perspective view illustrating the wiring board configuring the combination board illustrated in FIG. 8A.

When dividing the combination board 50A into individual stacked modules 10, if the division is made along the hypothetical dividing line L, along the bump electrodes 11C and 13C, as shown in FIG. 8A, the individual stacked modules 10A are obtained, as shown in FIG. 8B. The wiring patterns 11B, 12B, and 13B of the respective first, second, and third wiring boards 11, 12, and 13 and the bump electrodes 11C and 13C define side surface electrodes on the divided surface of the stacked modules 10A, as shown in FIG. 8C. Also, FIG. 9 is a perspective view illustrating the bump electrode 11C, facing upwards, of the first combination board 51 configuring the combination board 50A shown in FIGS. 8A through 8C.

Figure 10A:
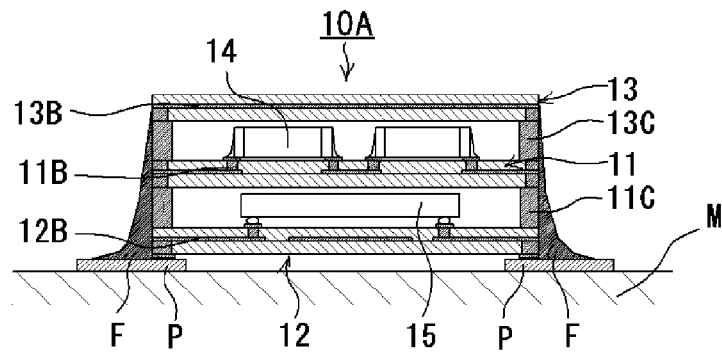
FIGS. 10A and 10B are each cross-sectional diagrams illustrating the state of the stacked module illustrated in FIG. 8A mounted on a motherboard.
Figure 10B:
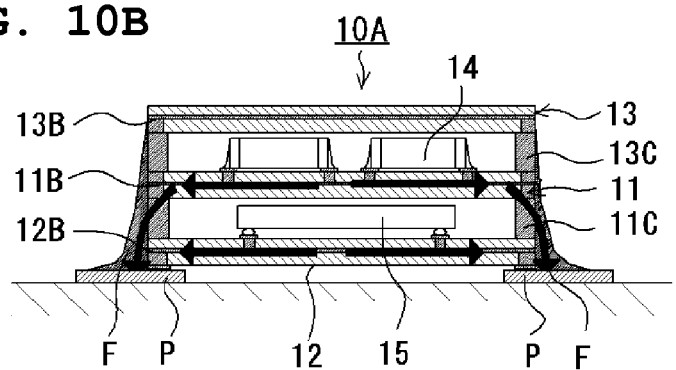

In the case of mounting the stacked modules 10A of the present preferred embodiment on a motherboard M, as shown in FIG. 10A, the stacked modules 10A are mounted while being matched to predetermined surface electrodes P of the motherboard M, following which solder is applied to the side surface electrode, heat processing is performed, thereby forming a soldered fillet F as shown in FIGS. 10A and 10B, and the stacked modules 10A can be electrically connected to the motherboard M.

According to the present preferred embodiment, the stacked modules 10A include a side surface electrode on the same plane as the side surface of the wiring board, and in order to form the soldered fillet F when the stacked modules 10A are mounted to the motherboard M, external inspection of the connection state can be easily performed via the soldered fillet F. Also, in the case of mounting the stacked modules 10A on the motherboard M, the generated heat from the chip-type passive components 14 and chip-type active components 15 can be efficiently scattered using not only the ceramic first and second wiring boards, but also the wiring patterns 11B, 12B, and 13B and the soldered fillet F as heat transfer paths, as shown with the arrows in FIG. 10B.

Fifth Preferred Embodiment

Figure 11A:
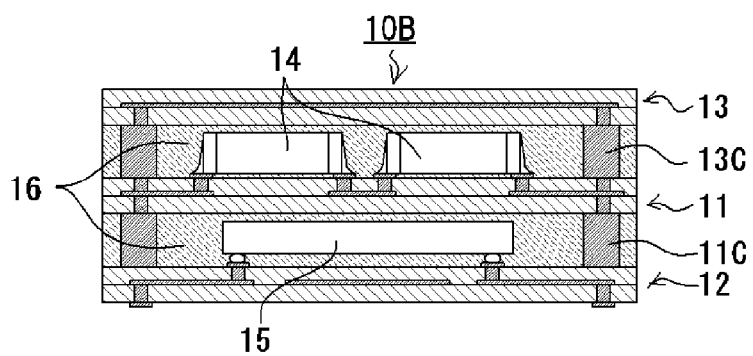
FIGS. 11A and 11B are each cross-sectional diagrams illustrating yet another preferred embodiment of the stacked module according to the present invention.
Figure 11B:
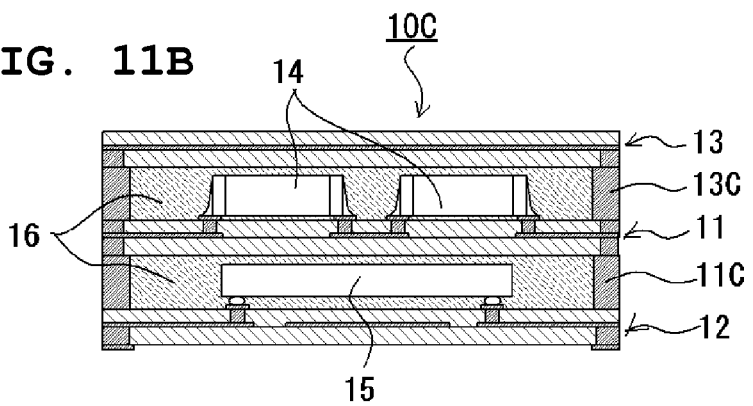

With the present preferred embodiment, a resin is injected into the space within the combination boards 50 and 50A of the third and fourth preferred embodiments, and except for sealing the chip-type passive components 14 or chip-type active components 15 with resin, the combination board is fabricated with the same procedures as the combination boards 50 and 50A of the third and fourth preferred embodiments. By dividing these combination boards, the stacked modules 10B and 10C shown in FIGS. 11A and 11B are obtained. With the stacked modules 10B and 10C shown in these diagrams, the space between the first wiring board 11 and second wiring board 12, and the space between the first wiring board 11 and the third wiring board 13 are both completely filled with a resin 16, such as a thermoset resin or other suitable resin. Thus, by injecting a resin 16 in the stacked modules 10B and 10C, the mechanical strength of each stacked module 10B and 10C is improved, and therefore, the chip-type passive components 14 or chip-type active components 15 can be securely fixed on the respective wiring boards 11 and 12, thus preventing damage resulting from external force, such as an impact or other external force. Note that the stacked modules which are obtained by dividing the combination boards are illustrated in FIGS. 11A and 11B, but even in the case of fabricating one stacked module at a time, a resin can be used to improve mechanical strength.

Other Preferred Embodiments

The stacked module according to the present invention can be modified to have various bump electrode configurations or mounting states of the surface mounted components, as shown in FIG. 12A through FIG. 18, for example. These stacked modules are configured according to the above-described preferred embodiments, except for the portions shown in FIG. 12A through FIG. 18. Accordingly, hereafter only the above-described preferred embodiments and the featured portions will be described based on FIG. 12A through FIG. 18. Note that in FIG. 12A through FIG. 17B, description is given of the relationship between the first wiring board 11 and the second wiring board 12, as an example.

1) Modification Example of Bump Electrode Form i) Bump Electrode Having a Taper

Figure 12A:
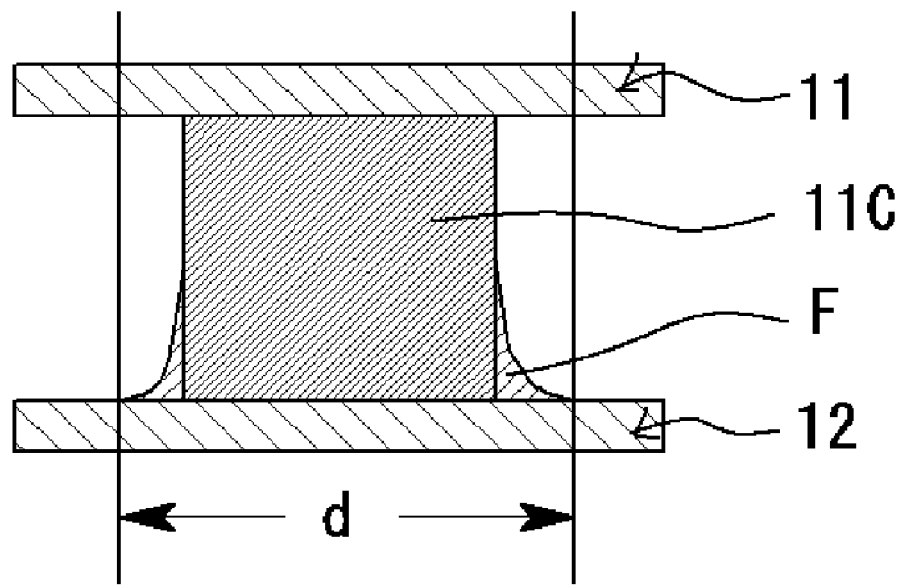
FIGS. 12A and 12B are each cross-sectional diagrams illustrating a bump electrode configuring the stacked module according to the present invention.
Figure 12B:
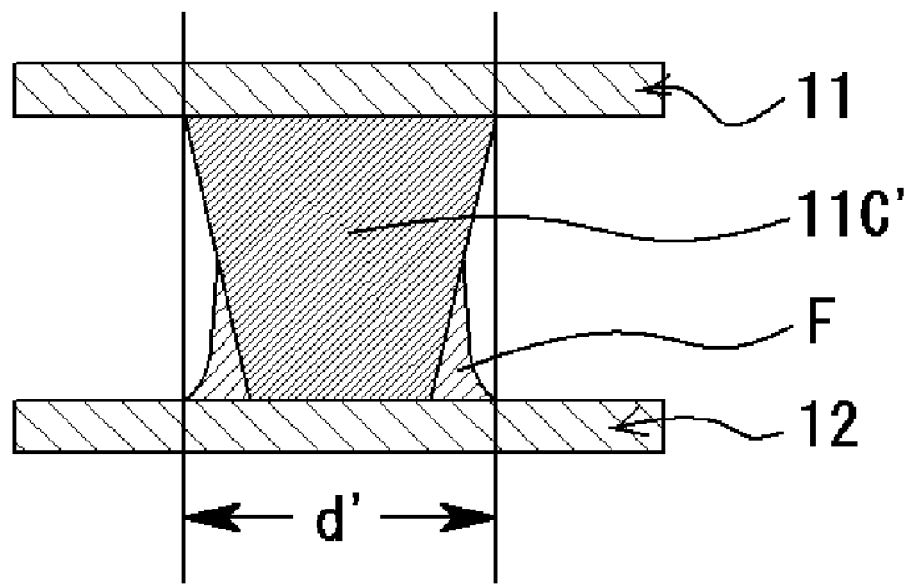

As shown in FIG. 12A, with the above-described preferred embodiments, a bump electrode 11C of the first wiring board 11 preferably has a straight cylinder shape, however, a shape in which the cross-section in the axis direction has a taper as shown in FIG. 12B, i.e. a bump electrode 11C' in an inverted trapezoid cone shape or an inverted quadrangle pyramid shape may be used. When the via hole is subjected to punching processing with a mold or the like, this becomes a via conductor 11C in a straight cylinder as shown in FIG. 12A, but with processing by laser light, a taper can be formed on the cross section as the bump electrode 11C' as shown in FIG. 12B. Accordingly, the connecting area of the second wiring board 12 of the via conductor 11C' including the soldering fillet F in FIG. 12B, i.e. the diameter d' is smaller as compared to the diameter d in the case of a straight cylinder shape shown in FIG. 12A.

ii) Bump Electrode Having a Radiating Fin

Figure 13A:
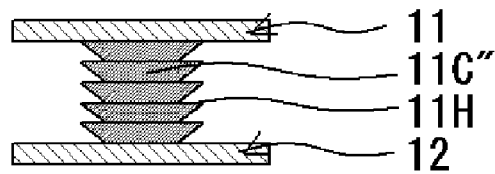
FIGS. 13A through 13D are each process diagrams illustrating a manufacturing process of yet another preferred embodiment of the stacked module according to the present invention.
Figure 13B:
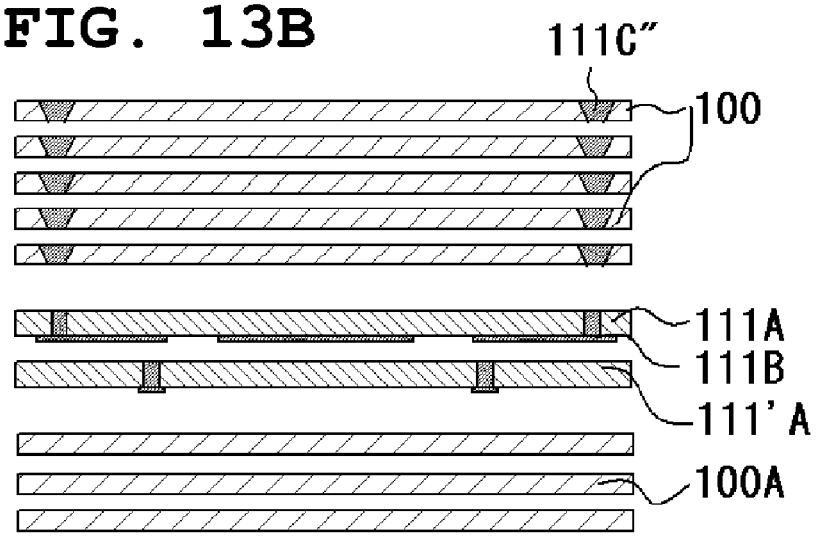
Figure 13C:
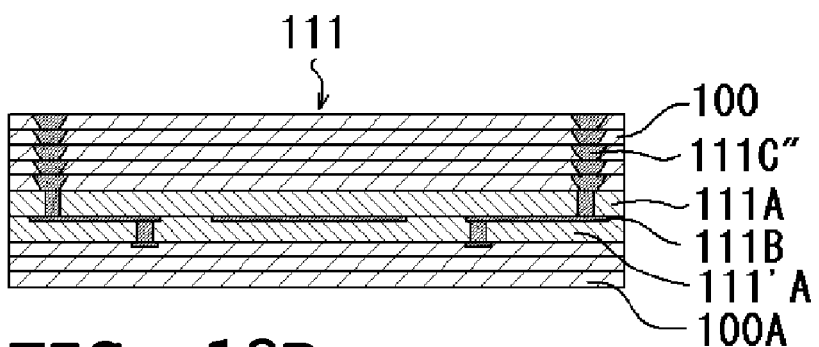
Figure 13D:
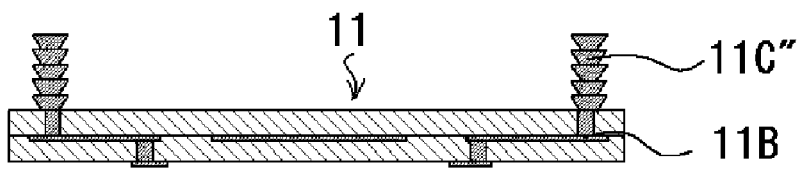

The bump electrode 11C" can be formed in a shape in which the cross-section has a radiating fin 11H with multiple trapezoid-shaped electrodes layered together as shown in FIG. 13A. The bump electrode 11C" of the first wiring board 11 has a greater surface area than that in a straight cylindrical shape, such that radiation is increased. Such a bump electrode 11C" is fabricated as described below. That is to say, in the event of fabricating the first and third wiring boards 11 and 13, an inverse cone shaped green via conductor 111C" is formed on one shrinkage suppression ceramic green sheet 100 as shown in FIG. 13B, following which as shown in FIG. 13C, these shrinkage suppression ceramic green sheets 100 are layered on board ceramic green sheets 111A having a green wiring pattern 111B which is layered on a shrinkage suppression ceramic green sheet 100A not including a green via conductor with the same procedures as that in the first preferred embodiment in accordance with the number of fins, and pressure-bonded, following which the layered article 111 is baked so as to obtain the first wiring board 11 having a bump electrode 11C" with a radiating fin, as shown in FIG. 13D.

iii) Connecting Bump

Figure 14A:
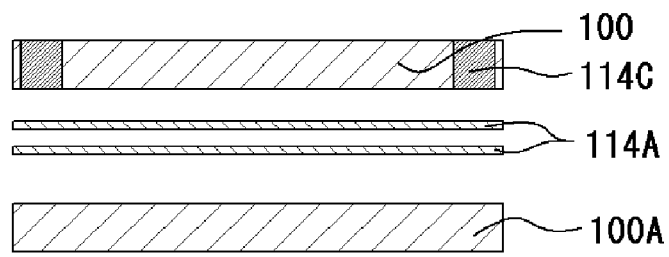
FIGS. 14A and 14B are each process diagrams illustrating the main portions of a manufacturing process of yet another preferred embodiment of the stacked module according to the present invention.
Figure 14B:
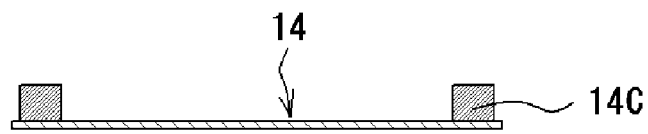

The connecting bump differs from a bump electrode in which conductivity is the object, and is a bump for connecting the upper and lower wiring boards in a particular configuration. For example, in the case of fabricating a protective board to protect the inner portion of the wiring board, forming a wiring pattern on the protective board which is conductive with the connecting bump is not required. Such a protective board can be fabricated as shown in FIG. 14A, for example. That is to say, as shown in this diagram, for a board ceramic green sheet 114A, two ceramic green sheets having a thickness of about 20 μm are layered, and on the lower surface thereof a shrinkage suppression ceramic green sheet 100A having a thickness of about 250 μm and not including a green via conductor is disposed, and on the upper surface thereof, a shrinkage suppression ceramic green sheet 100 having a thickness of about 250 μm and including a green connecting bump is disposed, and these are layered and pressure-bonded to produce the layered article. By baking this layered article, the protective board 14 having the connecting bumps 14C as shown in FIG. 14B is obtained. The protective board 14 has a thickness of about 20 μm. For a green connecting bump, a ceramic paste may be used with a low-temperature sintered ceramic as the primary component thereof, for example. The connecting bumps can be provided on the wiring board in combination with the bump electrodes.

iv) Height of Bump Electrodes

Figure 15A:
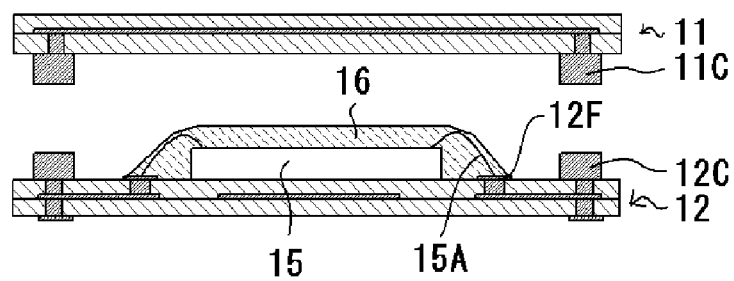
FIGS. 15A and 15B are each process diagrams illustrating the main portions of a manufacturing process of yet another preferred embodiment of the stacked module according to the present invention.
Figure 15B:
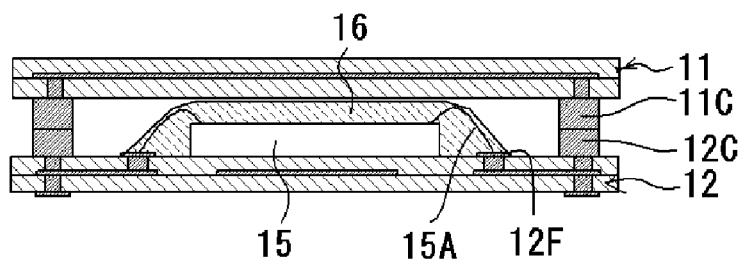

If the bump electrodes protrude substantially from the wiring board, damage may occur, such as loss, during transportation of the wiring board. Thus, as shown in FIGS. 15A and 15B, the bump electrodes may be provided on the surface facing both of the second wiring boards 11 and 12. Thus, by allocating the bump electrodes as bump electrodes 11C and 12C on both of the first and second wiring boards 11 and 12, the bump electrodes 11C and 12C can be set to, for example, about ½ the height, which suppresses and prevents damage, such as loss of the bump electrodes 11C and 12C during transportation. This can also be true for the connecting bumps for which conductivity is not required. Note that FIG. 15A illustrates the first and second wiring boards 11 and 12 before being layered, and FIG. 15B illustrates the first and second wiring boards 11 and 12 after being layered. Also, the chip-type active components 15 are sealed with a resin 16.

Figure 16:
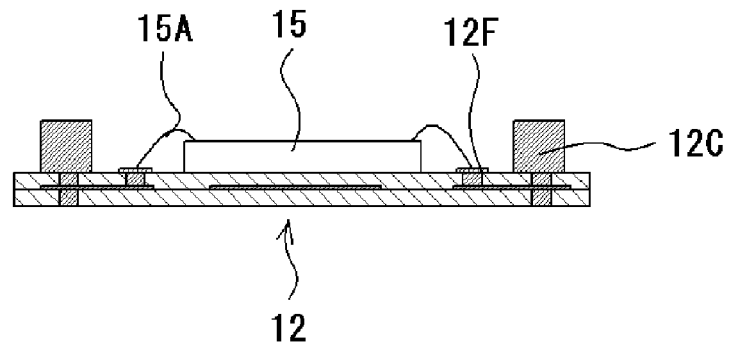
FIG. 16 is a cross-sectional diagram illustrating a mounting state of a surface mounted component of yet another preferred embodiment of the stacked module according to the present invention.

2) Modification Example of a Preferred Embodiment of Surface Mounted Components i) Mounting by Wire Bonding There may be cases in which the chip-type active components 15 connect to the surface electrodes 12F of a wiring board 12 via a wire 15A by the wire bonding as shown in FIGS. 15A and 15B and FIG. 16, as required. It is desirable for the bump electrodes 12C to be formed on the mounting surface of the second wiring board 12 as shown in FIG. 16. The wires 15A of the chip-type active components 15 can change shape due to external force, such as the transporting process of the wiring board 11, and can be destroyed. Thus, if the bump electrodes 12C are formed on the mounting surface of the chip-type active components 15, as shown in FIG. 16, the wire 15A can be protected from external force by the bump electrodes 12C. Even if these bump electrodes 12C are formed on the mounting surface of the chip-type active components 15, the chip-type active components 15 can be securely mounted by the wire bonding without damage. This is because even if the wire bonding includes a step of coating the adhesive on the surface electrodes 12F, a step of mounting the chip-type active components 15 to the second wiring board 12 to fix the chip-type active components 15 to the surface electrodes 12F via an adhesive, and a step of performing wire bonding, this process is performed from the upper portion of the mounting surface of the second wiring substrate 12.

ii) Mounting Portions for Surface Mounted Components

The surface mounted components can be provided on the upper surface and/or lower surface of the first and second wiring boards 11 and 12. Further, for surface mounting components, the chip-type passive components 14 and/or the chip-type active components 15 can be provided on the upper surface and/or lower surface of the first and second wiring boards 11 and 12.

Figure 17A:
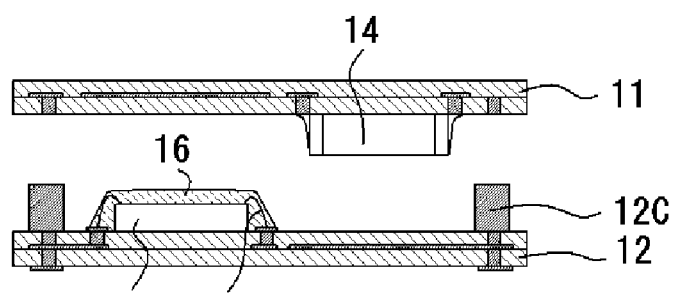
FIGS. 17A and 17B are cross-sectional diagrams illustrating a mounting state of a surface mounted component of yet another preferred embodiment of the stacked module according to the present invention.
Figure 17B:
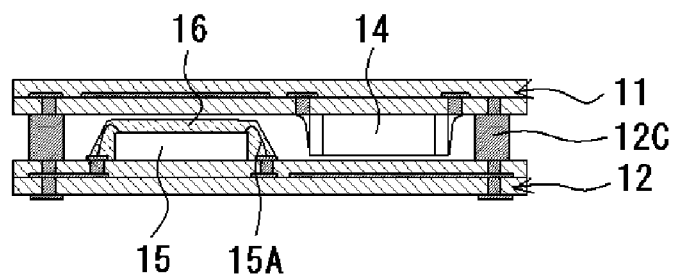

That is to say, as shown in FIGS. 17A and 17B, the chip-type passive components 14 are provided on the lower surface of the fist wiring board 11, as well as providing the chip-type active components 15 on the upper surface of the second wiring board 12, and a combination of the chip-type passive components 14 and chip-type active components 15 can be provided in the space between the first wiring board 11 and second wiring board. In this case, similar to the second wiring board 12 shown in FIG. 16, a bump electrode 12C is formed on the upper surface thereof, and chip-type active components 15 are mounted therein by wire bonding. Mounting the chip-type passive components 14 by soldering and mounting the chip-type active components 15 by wire bonding are generally difficult to perform on the same mounting surface. In other words, since mounting of the chip-type passive components 14 by soldering requires the metal mask to be adhered to the mounting surface, in the case of mounting on the same mounting surface as the chip-type active components 15, the mounting of chip-type passive components 14 by soldering must be performed first. However, with the soldering mounting, reflow processing is performed, but the surface electrodes of the mounting surface on which the wire bonding is to be performed can be oxidized from the heat at this time. Thus, wire bonding thereafter cannot usually be performed. Conversely, with the method shown in FIGS. 17A and 17B, the mounting by soldering and the mounting by wire bonding are performed on separated mounting surfaces. Thus, damage such as that described above does not occur, and both mountings can be securely performed. Moreover, the quality is improved and reliability is increased. Note that FIG. 17A shows the first and second wiring boards 11 and 12 before being layered, and FIG. 17B shows the first and second wiring boards 11 and 12 after being layered.

3) Modification Example of Number of Layers of Wiring Boards

Figure 18:
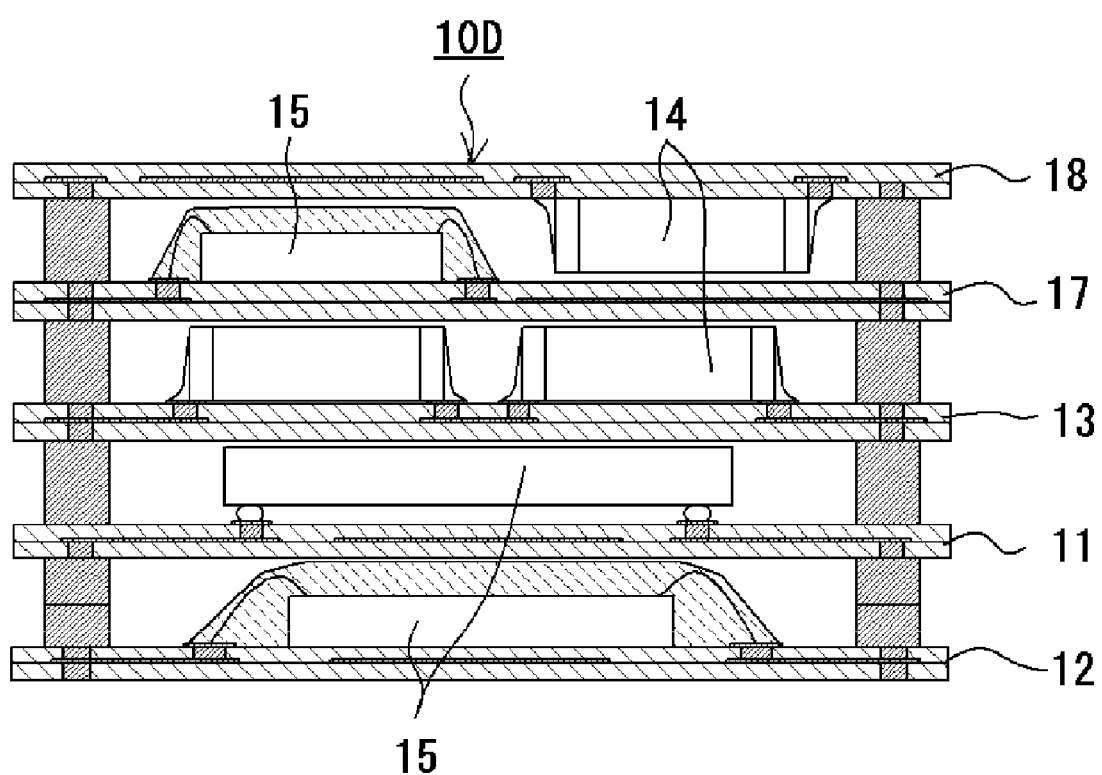
FIG. 18 is a cross-sectional view illustrating yet another preferred embodiment of the stacked module according to the present invention.

With the above-described preferred embodiments, a configuration is described wherein three wiring boards are layered. However, the number of layers of wiring boards can be appropriately set according to the desired capabilities and functionalities of the stacked modules. If the stacked module is highly functional, the number of layers increases accordingly. For example, FIG. 18 shows an example of a stacked module 10D using five wiring boards. In this case, the dimensions of the stacked module 10D are length 10 mm×width 10 mm×thickness 1 mm, for example, the thickness of each of the wiring boards 11, 12, 13, 17, and 18 is about 20 μm, and the height of the bump electrodes 61C through 65D is about 200 μm.

Note that the present invention is not restricted to the above-described preferred embodiments, and the chip-type passive components and chip-type active components can be mixed using several of each as required and mounted on both of the top and bottom surfaces of one wiring board, and also, the chip-type passive components and chip-type active components mounted on both wiring boards can be mixed within the space formed between the upper and lower wiring boards.

The present invention can be for a stacked module to be used for various types of electronic equipment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A stacked module manufacturing method comprising:
   a step of creating a first wiring board having a bump which is integrated with a board and extends in a direction substantially perpendicular to a surface of the board;
   a step of layering a second wiring board, which has a wiring pattern provided on at least one of a surface and an inner side thereof, on said first wiring board; and
   a step of connecting said second wiring board to said first wiring board via said bump; wherein
   said bump is disposed on the surface of the board and extends only in a direction away from the surface of the board on which the bump is disposed;
   said first wiring board further comprises a wiring pattern provided on at least one of the surface and an inner side thereof; and
   said bump is a bump electrode integrated with said wiring pattern by simultaneous sintering.

2. The stacked module manufacturing method according to claim 1, further comprising:
   a step of fabricating a board ceramic green body having a low-temperature sintering ceramic as a primary component and having a green wiring pattern on at least one of a surface and an inner side thereof;
   a step of fabricating a shrinkage suppressing ceramic green body having a hard-to-sinter ceramic which is not sintered at the baking temperature of said low-temperature sintering ceramic, as a primary component, and having a green via conductor defining said bump electrode;
   a step of layering said shrinkage suppressing ceramic green body on at least one principal surface of said board ceramic green body;
   a step of baking the board ceramic green body and the shrinkage suppressing ceramic green body at a baking temperature for said low-temperature sintering ceramics, and while sintering said board ceramic green body, integrating said green wiring pattern and said green via conductor by simultaneous sintering; and
   a step of removing said shrinkage suppressing ceramic green body.

3. The stacked module manufacturing method according to claim 1, said first wiring board further comprising:
   said bump electrode on a first principal surface thereof; and
   at least one of a chip-type passive component and a chip-type active component on at least one of said first principal surface and a second principal surface facing said first principal surface, as a surface mounted component.

4. The stacked module manufacturing method according to claim 3, wherein said first wiring board includes a chip-type active component connected to said first principal surface via a bonding wire.

5. The stacked module manufacturing method according to claim 3, wherein said first wiring board includes a chip-type active component connected to said second principal surface via a soldering bump.

6. The stacked module manufacturing method according to claim 3, wherein
   said first wiring board further comprises a chip-type passive component including a ceramic sintered article that defines an element body and a terminal electrode, said chip-type passive component being disposed on said second principal surface.

7. The stacked module manufacturing method according to claim 1, wherein the bump electrode of said first wiring board has a tapered cross-sectional shape.

8. The stacked module manufacturing method according to claim 1, wherein the bump electrode of said first wiring board is connected to said wiring pattern provided on the surface of said second wiring board via a brazing metal.

9. The stacked module manufacturing method according to claim 3, wherein,
   said first wiring board further comprises at least one of a chip-type passive component and a chip-type active component on a second principal surface thereof;
   said second wiring board further comprises an external connecting electrode on the first principal surface thereof, and at least one of another chip-type passive component and another chip-type active component on a second principal surface thereof which faces the first principal surface; and
   said wiring pattern of said first wiring board and said wiring pattern of said second wiring board are connected via the bump electrode on said first wiring board, such that the first principal surface of said first wiring board and the second principal surface of said second wiring board face one another.

10. The stacked module manufacturing method according to claim 1, wherein
    said second wiring board also includes a bump electrode thereupon, integrated with the wiring pattern thereof by simultaneous sintering; and
    said first wiring board and said second wiring board are connected by connecting the bump electrode of said first wiring board and the bump electrode of said second wiring board.

11. The stacked module manufacturing method according to claim 1, wherein said bump electrode is formed on both principal surfaces of said first wiring board.

12. The stacked module manufacturing method according to claim 1, further comprising a step in which said first wiring board and said second wiring board are connected in a combination board, and the combination board is divided into individual stacked modules.

13. The stacked module manufacturing method according to claim 12, wherein when dividing the combination board, said bump electrode is also divided, resulting in the stacked modules including a divided surface of the bump electrode defining a side surface electrode.

14. The stacked module manufacturing method according to claim 1, wherein a space between said first wiring board and said second wiring board is sealed with a resin.

* * * * *